(12) United States Patent
Parikh et al.

(10) Patent No.: US 10,629,484 B1
(45) Date of Patent: Apr. 21, 2020

(54) METHOD OF FORMING SELF-ALIGNED VIA

(71) Applicant: Applied Materials, Inc., Santa Clara, CA (US)

(72) Inventors: Suketu Arun Parikh, San Jose, CA (US); Mihaela Balseanu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/177,883

(22) Filed: Nov. 1, 2018

(51) Int. Cl.
*H01L 23/522* (2006.01)
*H01L 21/768* (2006.01)
*H01L 21/02* (2006.01)
*H01L 21/033* (2006.01)

(52) U.S. Cl.
CPC .... *H01L 21/76897* (2013.01); *H01L 21/0217* (2013.01); *H01L 21/0337* (2013.01); *H01L 21/76819* (2013.01); *H01L 21/76834* (2013.01); *H01L 21/76868* (2013.01); *H01L 21/76879* (2013.01); *H01L 23/5226* (2013.01)

(58) Field of Classification Search
CPC .......... H01L 21/76897; H01L 21/0217; H01L 21/0337; H01L 21/76819; H01L 21/76834; H01L 21/76868; H01L 21/76879; H01L 23/5226
See application file for complete search history.

(56) References Cited

U.S. PATENT DOCUMENTS

6,127,263 A  10/2000  Parikh

*Primary Examiner* — Timor Karimy
(74) *Attorney, Agent, or Firm* — Servilla Whitney LLC (57) ABSTRACT

Electronic devices and methods to form electronic devices having a self-aligned via are described. An adhesion enhancement layer is utilized to promote adhesion between the conductive material and the sidewalls of the at least one via opening. The self-aligned vias decrease via resistance and reduce the potential to short to the wrong metal line.

16 Claims, 4 Drawing Sheets

METHOD OF FORMING SELF-ALIGNED VIA

TECHNICAL FIELD

Embodiments of the present disclosure pertain to the field of electronic device manufacturing, and in particular, to an integrated circuit (IC) manufacturing. More particularly, embodiments of the disclosure are directed to electronic devices and methods of forming electronic devices with self-aligned vias.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

As the size of the IC decreases, the spacing between the metal lines decreases. Typically, to manufacture an interconnect structure, a planar process is used that involves aligning and connecting one layer of metallization to another layer of metallization.

Typically, patterning of the metal lines in the metallization layer is performed independently from the vias above that metallization layer. Conventional via manufacturing techniques, however, cannot provide via self-alignment. In the conventional techniques, the vias formed to connect lines in an upper metallization layer to a lower metallization are often misaligned to the lines in the lower metallization layer. The via-line misalignment increases via resistance and leads to potential shorting to the wrong metal line. The via-line misalignment causes device failures, decreases yield and increases manufacturing cost. Accordingly, there is a need for methods of forming self-aligned vias.

SUMMARY

Electronic devices and methods of forming electronic devices having a self-aligned via are described. In one or more embodiments, a method of forming an electronic device comprises providing a substrate having a first insulating layer thereon, the first insulating layer having a top surface and a plurality of trenches formed along a first direction, the plurality of trenches having a first conductive material with a first conductive surface substantially coplanar with the top surface of the first insulating layer; selectively depositing an etch stop layer on the first conductive surface; forming a mask layer on the first insulating layer, the mask layer having a top surface substantially coplanar with a top surface of the etch stop layer; depositing a second insulating layer on the top surface of one or more of the etch stop layer or the mask layer; planarizing the second insulating layer to form at least one via opening, the at least one via opening having a bottom surface comprising an exposed portion of the top surface of the etch stop layer and an exposed portion of the top surface of the mask layer; and selectively removing the etch stop layer exposed through the via opening so that the bottom surface of the via opening comprises the first conductive material.

In one or more embodiments, an electronic device is described. In one or more embodiments, an electronic device comprises: a substrate comprising a first insulating layer having a plurality of trenches extending along a first direction, the plurality of trenches having a first conductive material therein; an etch stop layer on at least one of the first conductive materials; a mask layer formed on the first insulating layer, the mask layer having a top surface substantially coplanar with a top surface of the etch stop layer and having a plurality of openings exposing a portion of the first conductive material, each of the plurality of openings having sidewalls; a second insulating layer on the mask layer and etch stop layer, the second insulating layer having a plurality of openings aligned with the openings in the mask layer, each of the plurality of openings having sidewalls; a second conductive material in the openings of the mask layer and second insulating layer, the second conductive material having gaps between the second conductive material and the sidewalls of the openings; and an adhesion enhancement layer in the gaps.

One or more embodiments are directed to a method of forming an electronic device. In one or more embodiments, a method of forming an electronic device comprises: providing a substrate having a first insulating layer, an etch stop layer, and a second insulating thereon, the first insulating layer having a top surface and a plurality of trenches formed along a first direction, the plurality of trenches having a first conductive material, the first conductive material with a first conductive surface substantially coplanar with the top surface of the first insulating layer, the second insulating layer having at least one mis-aligned via opening having a bottom surface comprising an exposed portion of one or more of the top surface of the first insulating layer or a top surface of the first conductive material; recessing the first conductive material through the mis-aligned via opening so that the first conductive surface is below the top surface of the first insulating layer and creating an aligned via opening; selectively depositing a second conductive material in the aligned via opening on the first conductive surface, wherein the second conductive material forms on the first conductive material with gaps between sides of the second conductive material and one or more of the etch stop layer, the first insulating layer, or the second insulating layer; and depositing an adhesion enhancement layer in the gaps.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Electronic devices and methods to form an electronic device having a self-aligned via are described. In one or more embodiments, a method to for an electronic device is described. A substrate is provided having a first insulating layer thereon, the first insulating layer having a top surface and a plurality of trenches formed along a first direction, the plurality of trenches having a first conductive material with a first conductive surface substantially coplanar with the top surface of the first insulating layer. An etch stop layer is selectively deposited on the first conductive surface. A mask layer is formed on the first insulating layer, the mask layer having a top surface substantially coplanar with a top surface of the etch stop layer. A second insulating layer is deposited on the top surface of one or more of the etch stop layer or the mask layer. The second insulating layer is planarized to form at least one via opening, the at least one via opening having a bottom surface comprising an exposed portion of the top surface of the etch stop layer and an exposed portion of the top surface of the mask layer. The etch stop layer exposed through the via opening is selectively removed so that the bottom surface of the via opening comprises the first conductive material.

As used herein, the term "self-aligned via" refers to a via that is self-aligned along at least two directions to the conductive lines in a lower (or first) and an upper (or second) metallization layer.

Compared to conventional techniques, some embodiments advantageously provide self-aligned vias with anchoring to improve adhesion. In some embodiments, the self-aligned vias provide lower via resistance and capacitance benefits over the conventional vias. Some embodiments of the self-aligned vias provide full alignment between the vias and the conductive lines of the metallization layers that is substantially error free that advantageously increase the device yield and reduce the device cost. Additionally, some embodiments of the self-aligned vias provide larger contact area and lower via resistance for the fully self-aligned approach.

The individual components of the electronic device 100, including the semiconductor substrate 102, the insulating layers 104, 116, the etch stop layer 112, the mask layer 114, the conductive materials 106, 120, and the adhesion enhancement layer 125 can be formed by any suitable process or processes known to the skilled artisan. FIGS. 1-10B illustrate an electronic device and a method of manufacturing an electronic device according to one or more embodiments of the disclosure.

Figure 1:
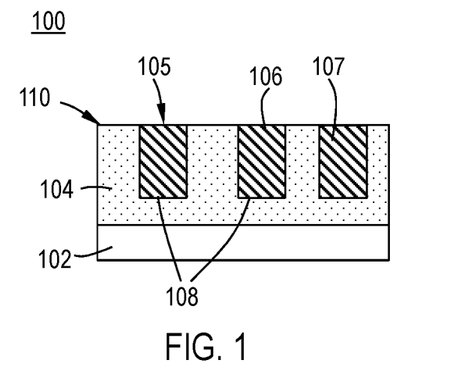
FIG. 1 illustrates a cross-sectional view of an electronic device according to one embodiment.

FIGS. 1-10B illustrate cross-sectional views of an electronic device 100 to provide a self-aligned via according to one or more embodiments. Referring to FIG. 1, a first insulating layer 104 on a substrate 102 is provided. As used in this specification and the appended claims, the term "provided" means that the substrate 102 is made available for processing (e.g., positioned in a processing chamber). The first insulating layer has a top surface 110 and a plurality of trenches 108 formed along a first direction, the plurality of trenches 108 having a first conductive material 106 with a first conductive surface 105 substantially coplanar with the top surface 110 of the first insulating layer 104.

In one or more embodiments, the substrate 102 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In one or more embodiments, substrate 102 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 102 can be, e.g., an organic, a ceramic, a glass, or a semiconductor substrate. Although a few examples of materials from which the substrate 102 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, substrate 102 includes one or more metallization interconnect layers for integrated circuits. In at least some embodiments, the substrate 102 includes interconnects, for example, vias, configured to connect the metallization layers. In at least some embodiments, the substrate 102 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one or more embodiments, the substrate 102 includes one or more layers above substrate 102 to confine lattice dislocations and defects.

First insulating layer 104 can be any material suitable to insulate adjacent devices and prevent leakage. In one or more embodiments, electrically insulating layer 104 is an oxide layer, e.g., silicon dioxide, or any other electrically insulating layer determined by an electronic device design. In one or more embodiments, first insulating layer 104 comprises an interlayer dielectric (ILD). In one or more embodiments, first insulating layer 104 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the first insulating layer 104, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

In one or more embodiments, first insulating layer 104 includes a dielectric material having a K-value less than 5. In one or more embodiments, first insulating layer 104 includes a dielectric material having a K-value of from about 2 to about 4. In at least some embodiments, first insulating layer 104 includes oxides, carbon doped oxides, Black Diamond®, porous silicon dioxide, carbides, oxycarbides, nitrides, oxynitrides, oxycarbonitrides, polymers, phosphosilicate glass, fluorosilicate (SiOF) glass, organosilicate glass (SiOCH), fluorosilicate glass (FSG), porous low-K, or any combinations thereof, other electrically insulating layer determined by an electronic device design, or any combination thereof. In at least some embodiments, first insulating layer 104 may include polyimide, epoxy, photodefinable materials, such as benzocyclobutene (BCB), and WPR-series materials, or spin-on-glass.

In one or more embodiments, first insulating layer 104 is a low-K interlayer dielectric to isolate one metal line from other metal lines on substrate 102. In one or more embodiments, the thickness of the first insulating layer 104 is in an approximate range from about 10 nanometers (nm) to about 2 microns (μm).

In one or more embodiments, first insulating layer 104 is deposited using one of deposition techniques, such as but not limited to a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

Referring to FIG. 1, a plurality of trenches 108 is formed along a first direction in the first insulating layer 104. A lower metallization layer (Mx) comprises a first conductive material 106 which comprises a set of conductive lines 107 that extend along an X axis (direction) 122 on the first insulating layer 104 on a substrate 102. The X axis of FIG. 1 extends orthogonally to the plane of the Figure page. As shown in FIG. 1, X axis (direction) 122 crosses Y axis (direction) 124 at an angle 126. In one or more embodiments, angle 126 is about 90 degrees. In another embodiment, angle 126 is an angle that is other than the 90 degrees angle. The first insulating layer 104 comprises trenches 108. The first conductive material 106 is deposited in trenches 108.

In one or more embodiments, the lower metallization layer Mx comprising first conductive material 106 is a part of a back end metallization of the electronic device. In one or more embodiments, the first insulating layer 104 is patterned and etched using a hard mask to form trenches 108 using one or more patterning and etching techniques known to one of ordinary skill in the art of microelectronic device manufacturing. In one or more embodiments, the size of trenches 108 in the first insulating layer 104 is determined by the size of conductive lines formed later on in a process.

In one or more embodiments, forming the first conductive material 106 involves filling the trenches 108 with a layer of conductive material. In one or more embodiments, a base layer (not shown) is first deposited on the internal sidewalls and bottom of the trenches 108, and then the conductive layer is deposited on the base layer. In one or more embodiments, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the first insulating layer 104. Additionally, the conductive barrier layer can be used to provide adhesion for the seed layer (e.g., copper).

In one or more embodiments, to form the base layer, the conductive barrier layer is deposited onto the sidewalls and bottom of the trenches 108, and then the seed layer is deposited on the conductive barrier layer. In another embodiment, the conductive base layer includes the seed layer that is directly deposited onto the sidewalls and bottom of the trenches 108. Each of the conductive barrier layer and seed layer may be deposited using any thin film deposition technique known to one of ordinary skill in the art of semiconductor manufacturing, e.g., sputtering, blanket deposition, and the like. In one or more embodiments, each of the conductive barrier layer and the seed layer has the thickness in an approximate range from about 1 nm to about 100 nm. In one or more embodiments, the barrier layer may be a thin dielectric that has been etched to establish conductivity to the metal layer below. In one or more embodiments, the barrier layer may be omitted altogether and appropriate doping of the copper line may be used to make a "self-forming barrier".

In one or more embodiments, the conductive layer e.g., copper or cobalt, is deposited onto the seed layer of base layer of copper, by an electroplating process. In one or more embodiments, the conductive layer is deposited into the trenches 108 using a damascene process known to one of ordinary skill in the art of microelectronic device manufacturing. In one or more embodiments, the conductive layer is deposited onto the seed layer in the trenches 108 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one or more embodiments, the choice of a material for conductive layer for the first conductive material 106 determines the choice of a material for the seed layer. For example, if the material for the first conductive material 106 includes copper, the material for the seed layer also includes copper. In one or more embodiments, the first conductive material 106 includes a metal, for example, copper (Cu), ruthenium (Ru), nickel (Ni), cobalt (Co), molybdenum (Mo), rhodium (Rh), iridium (Ir), niobium (Nb), nickel silicon (NiSi), ternary max compound ($LaRu_2As_2$), or any combination thereof.

In one or more embodiments, portions of the conductive layer and the base layer are removed to even out top portions of the first conductive material 106 with top portions of the first insulating layer 104 using a chemical-mechanical polishing ("CMP") technique known to one of ordinary skill in the art of microelectronic device manufacturing.

In one non-limiting example, the thickness (as measured along the z-axis of FIG. 1) of the first conductive material 106 is in an approximate range from about 15 nm to about 1000 nm. In one non-limiting example, the thickness of the first conductive material 106 is from about 20 nm to about 200 nm. In one non-limiting example, the width (as measured along the y-axis of FIG. 1) of the first conductive material 106 is in an approximate range from about 5 nm to about 500 nm. In one non-limiting example, the spacing (pitch) between the set of conductive lines of the first conductive material 106 is from about 2 nm to about 500 nm. In more specific non-limiting examples, the spacing (pitch) between the set of conductive lines of the first conductive material 106 is from about 5 nm to about 50 nm.

In one or more embodiments, the lower metallization layer Mx is configured to connect to other metallization layers (not shown). In one or more embodiments, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Figure 2:
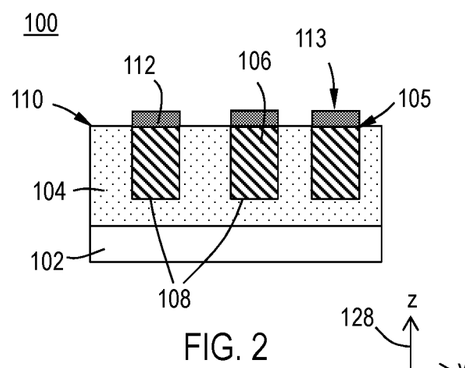
FIG. 2 illustrates a cross-sectional view of an electronic device according to one embodiment.

With reference to FIG. 2, an etch stop layer 112 is selectively deposited on the first conductive surface 105. In one or more embodiments, the etch stop layer 112 comprises one or more of silicon nitride, aluminum oxide, silicon carbonitride, hafnium oxide, silicon oxycarbonitride, or aluminum nitride. In one or more specific embodiments, the etch stop layer 112 comprises silicon nitride. In one or more embodiments, the etch stop layer 112 has a thickness greater than 10 nm, including greater than 15 nm, or greater than 20 nm.

Figure 3:
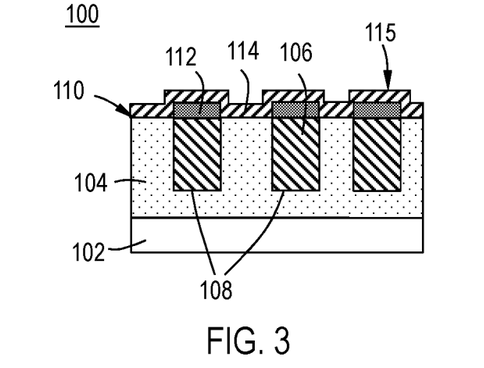
FIG. 3 illustrates a cross-sectional view of an electronic device structure to provide a self-aligned via according to one embodiment.

FIG. 3 is a cross-sectional view similar to cross-sectional view of FIG. 2, after a mask layer 114 is formed on a top surface 110 of the first insulating layer 104. In one or more embodiments, the mask layer 114 is formed on a top surface 113 of the etch stop layer 112 and on a top surface of the first insulating layer 104. In one or more embodiments, the mask layer 114 comprises one or more of aluminum oxide, silicon dioxide, silicon oxide, silicon carbonitride, silicon oxycarbide, and the like. In one or more embodiments, the mask layer 114 has a thickness greater than 10 nm, including greater than 15 nm, or greater than 20 nm.

In one or more embodiments, forming the mask layer 114 on the first insulating layer 104 comprises conformally depositing a mask material on the top surface 113 of the first insulating layer 104 and the etch stop layer 112, and planarizing the substrate 102 to remove the mask material from the top surface 113 of the etch stop layer 112 to expose the etch stop layer. The mask material may be any appropriate mask material known to one of skill in the art. In one or more embodiments, the mask materials comprises on or more of aluminum oxide, silicon oxide, silicon carbonitride, silicon oxycarbide, and the like.

Figure 4:
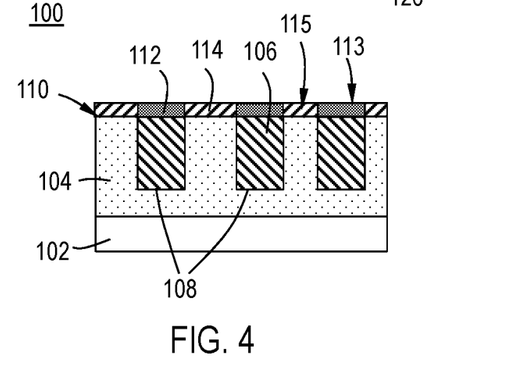
FIG. 4 illustrates a cross-sectional view of an electronic device according to one embodiment.

With reference to FIG. 4, in one or more embodiments, the mask layer 114 has a top surface 115 that is substantially coplanar with the top surface 113 of the etch stop layer 112. In some embodiments, the substrate 102 is planarized and portions of the mask layer 114 and/or portions of the etch stop layer 112 are removed using one of the chemical-mechanical planarization (CMP) techniques known to one of ordinary skill in the art of microelectronic device manufacturing. During CMP, mask layer 114 is likely to decrease in thickness. The decrease in thickness of mask layer 114 may be in the range of about 2 nm to about 4 nm.

Figure 5:
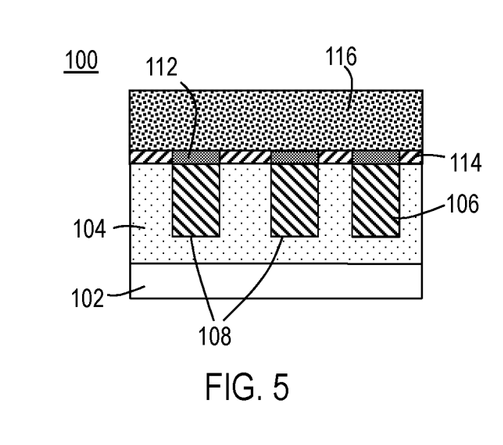
FIG. 5 illustrates a cross-sectional view of an electronic device according to one embodiment.

With reference to FIG. 5, in one or more embodiments, a second insulating layer 116 is deposited on the top surface of one or more of the etch stop layer 112 or the mask layer 114.

The second insulating layer 116 can be any material suitable to insulate adjacent devices and prevent leakage. In one or more embodiments, the second insulating layer 116 is the same material as the first insulating layer 104. In one or more embodiments, the second insulating layer 116 is an oxide layer, e.g., silicon dioxide, or any other electrically insulating layer determined by an electronic device design. In one or more embodiments, second insulating layer 116 comprises an interlayer dielectric (ILD). In one or more embodiments, second insulating layer 116 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one or more embodiments, the second insulating layer 116 includes a dielectric material having a K-value less than 5. In one or more embodiments, second insulating layer 116 includes a dielectric material having a K-value less than 2. In at least some embodiments, second insulating layer 116 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, second insulating layer 116 may include polyimide, epoxy, photodefinable materials, such as benzocyclobutene (BCB), and WPR-series materials, or spin-on-glass.

In one or more embodiments, second insulating layer 116 is a low-K interlayer dielectric to isolate one metal line from other metal lines on substrate 102. In one or more embodiments, the thickness of the second insulating layer 116 is in an approximate range from about 10 nanometers (nm) to about 2 microns (μm).

In one or more embodiments, the first insulating layer 104 and the second insulating layer 116 are independently selected from oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof In one or more embodiments, second insulating layer 116 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

Figure 6:
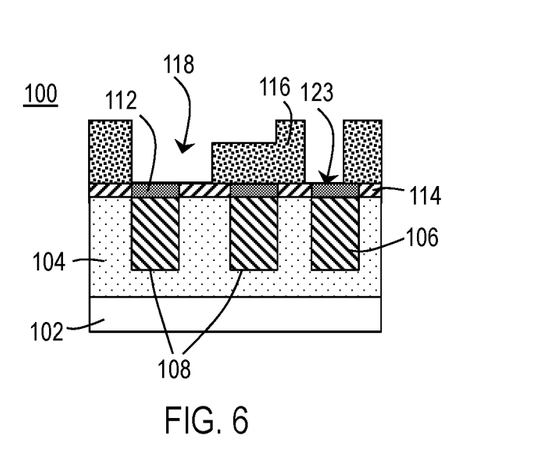
FIG. 6 illustrates a cross-sectional view of an electronic device according to one embodiment.

Referring to FIG. 6, in one or more embodiments, the second insulating layer 116 is planarized to form at least one via opening 118. The at least one via opening 118 has a bottom surface 123 comprising an exposed portion of the top surface 113 of the etch stop layer 112 and an exposed portion of the top surface 115 of the mask layer 114. As used herein, the term "planarized" refers to a process of smoothing surfaces and includes, but is not limited to, chemical mechanical polishing/planarization (CMP), etching, and the like.

Without intending to be bound by theory, it is thought that planarizing the second insulating layer 116 to form at least one via opening 118 having a bottom surface 123 comprising an exposed portion of the top surface 113 of the etch stop layer 112 and an exposed portion of the top surface 115 of the mask layer 114, thus creates a two color (i.e. dual etch stop) scheme, which will help to self-align vias in the region of underlying metal. As used herein, the term "two color" refers to two different materials which are selectively etchable relative to each other. In other words, one material will be etched, while the other materials will not be etched due to selectivity between two color (dielectric films of different properties and chemistry required to etch them).

In one or more embodiments, planarizing the second insulating layer 116 comprises a dual damascene process. As used herein, the term "damascene process" refers to a process wherein a dielectric is first deposited onto a substrate, which is then patterned and filled by metal deposition. As used herein, the term "dual damascene process" refers to a process wherein vias and trenches are patterned in such a way that metal deposition fills both the vias and trenches at the same time. Thus, in one or more embodiments, the second insulating layer 116 is deposited on the top surface of one or more of the etch stop layer 112 or the mask layer 114 and is then patterned using standard lithograph and etching techniques to form the via opening 118. Then, a diffusion barrier (e.g. a tantalum-based layer) is deposited (not illustrated). A thin metal seed (e.g. copper) is then deposited by physical vapor deposition (PVD), following by the electroplating of the metal seed, which fills the via opening 118 (not illustrated). The excess metal (e.g. copper) is removed by a chemical mechanical polishing process (CMP) and an etch stop layer is deposited (not illustrated).

Figure 7A:
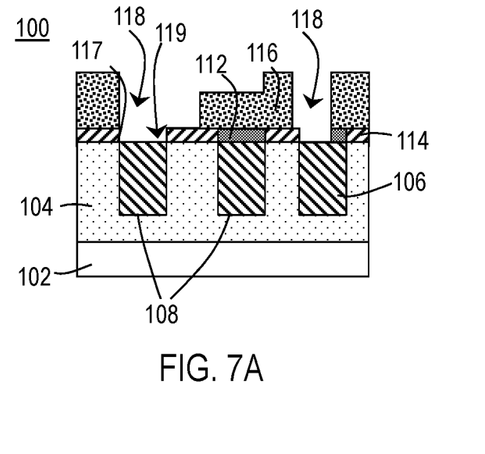
FIG. 7A illustrates a cross-sectional view of an electronic device structure according to one embodiment.

With reference to FIG. 7A, the etch stop layer 112 that is exposed through the via opening 118 is selectively removed so that the bottom surface 123 comprises the first conductive material 106.

Figure 7B:
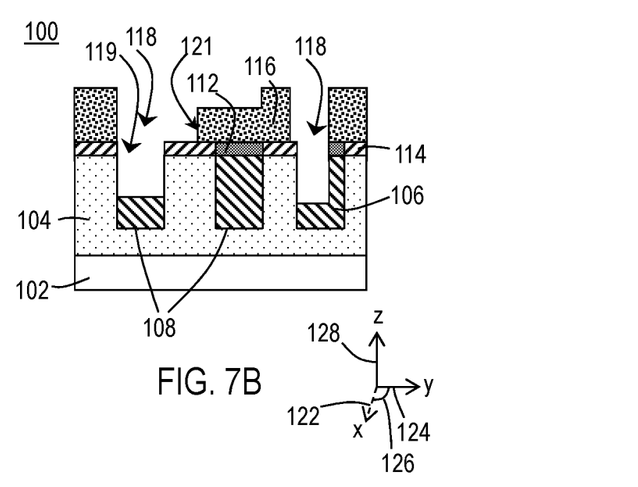
FIG. 7B illustrates a cross-sectional view of an electronic device according to one embodiment.

With reference to FIG. 7B, in one or more embodiments, the first conductive material 106 is recessed through the via opening 118 so that the first conductive surface 105 is below the top surface 110 of the first insulating layer 104. In one or more embodiments, the first conductive material is recessed using one or more of wet etching, dry etching, or a combination thereof techniques known to one of ordinary skill in the art of electronic device manufacturing.

Figure 8A:
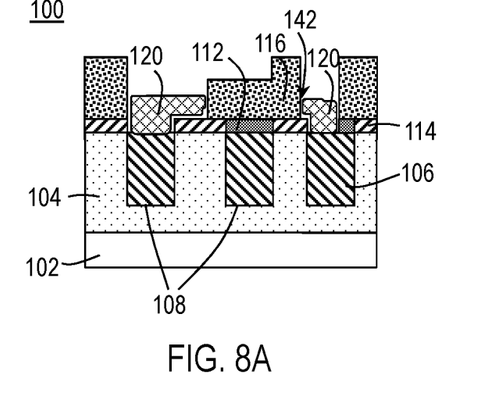
FIG. 8A illustrates a cross-sectional view of an electronic device according to one embodiment.

Referring to FIG. 8A, in one or more embodiments, a second conductive material 120 is deposited in the via opening 118 onto the first conductive surface 105 to form a via.

Figure 8B:
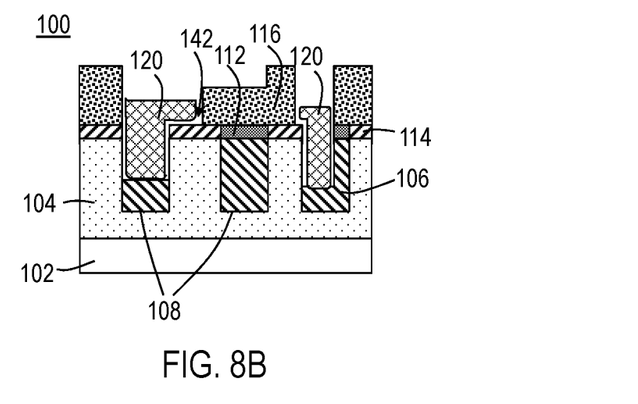
FIG. 8B illustrates a cross-sectional view of an electronic device according to one embodiment.

Referring to FIG. 8B, in one or more embodiments, a second conductive material 120 is deposited in the via opening 118 onto the recessed first conductive surface 105 to form a via.

In one or more embodiments, the second conductive material 120 comprises a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the second conductive material 120 comprises tungsten (W) or ruthenium (Ru).

In one or more embodiments, the second conductive material 120 is deposited using one of deposition techniques, such as but not limited to an ALD, a CVD, PVD, MBE, MOCVD, spin-on or other liner deposition techniques known to one of ordinary skill in the art of microelectronic device manufacturing.

In some embodiments, deposition of the second conductive material 120 includes formation of a seed gapfill layer (not shown). As will be understood by the skilled artisan, a seed gapfill layer is a relatively thin layer of material that can increase the nucleation rate (i.e., growth rate) of the second conductive material 120. In some embodiments, the seed gapfill layer is the same material as the second conductive material 120 deposited by a different technique. In some embodiments, the seed gapfill layer is a different material than the second conductive material 120.

In one or more embodiments, forming the second conductive material 120 involves depositing a layer of second conductive material in the at least one via opening 118.

In one non-limiting example, the thickness (as measured along the z-axis of FIGS. 8A and 8B) of the second conductive material 120 is in an approximate range from about 15 nm to about 1000 nm. In one non-limiting example, the thickness of the second conductive material 120 is from about 20 nm to about 200 nm. In one non-limiting example, the width (as measured along the y-axis of FIGS. 8A and 8B) of the second conductive material 120 is in an approximate range from about 5 nm to about 500 nm.

With reference to FIG. 8A, in one or more embodiments, the second conductive material 120 forms on the first conductive material 106 with gaps 142 between the sides of the second conductive material 120 and one or more of the etch stop layer 112 or the second insulating layer 116.

With reference to FIG. 8B, in one or more embodiments, the second conductive material 120 forms on the first conductive material 106 with gaps 142 between the sides of the second conductive material 120 and one or more of the etch stop layer 112, the first insulating layer 104, or the second insulating layer 116.

Figure 9A:
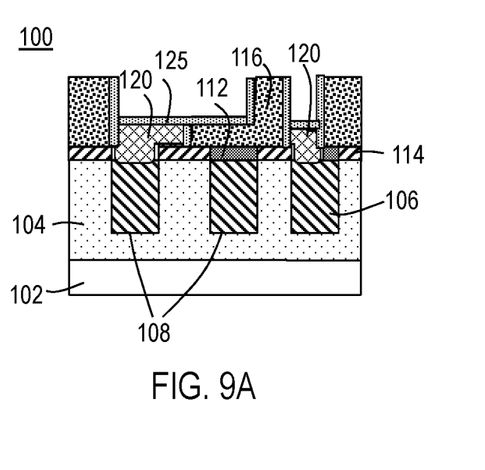
FIG. 9A illustrates a cross-sectional view of an electronic device according to one embodiment.
Figure 9B:
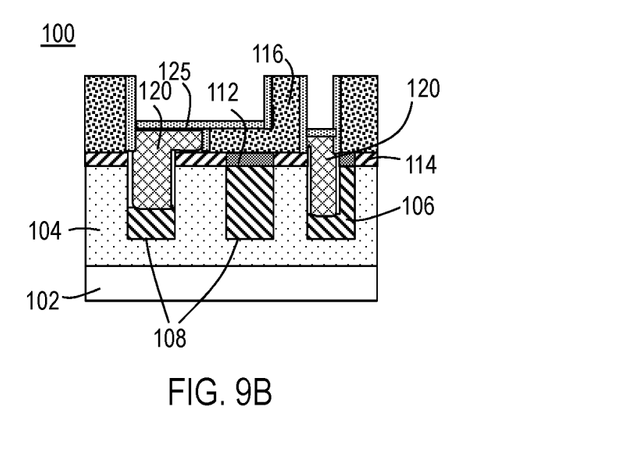
FIG. 9B illustrates a cross-sectional view of an electronic device according to one embodiment.

With reference to FIG. 9A, in one or more embodiments, an adhesion enhancement layer 125 is deposited in the gaps 142. With reference to FIG. 9B, in one or more embodiments, an adhesion enhancement layer 125 is deposited in the gaps 142.

The adhesion enhancement layer 125 can be any material suitable to fill gaps and promote adhesion between the second conductive material 120 and the sidewalls of the at least one via opening 118.

In one or more embodiments, the adhesion enhancement layer 125 comprises silicon nitride. In one or more embodiments, the adhesion enhancement layer 125 is deposited using an atomic layer deposition (ALD) technique. In one or more embodiments, the adhesion enhancement layer 125 is deposited using one of deposition techniques, such as but not limited to a CVD, PVD, MBE, MOCVD, spin-on, or other liner deposition techniques know to one of ordinary skill in the art of microelectronic device manufacturing. Without intending to be bound by theory, it is thought that the adhesion enhancement layer 125 creates an anchor for the second conductive material 120 in order to prevent diffusion and improve adhesion.

Figure 10A:
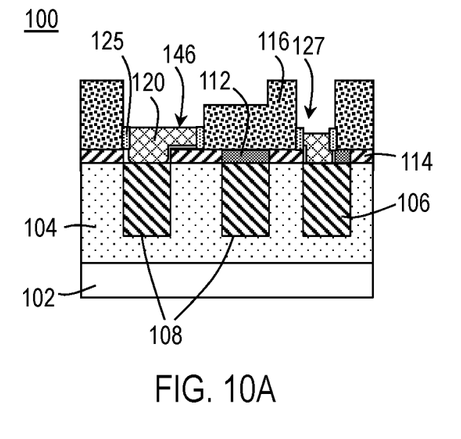
FIG. 10A illustrates a cross-sectional view of an electronic device according to one embodiment.
Figure 10B:
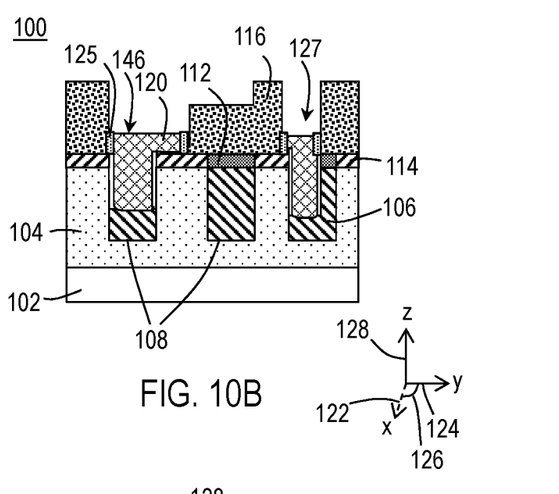
FIG. 10B illustrates a cross-sectional view of an electronic device according to one embodiment.

Referring to FIGS. 10A and 10B, the adhesion enhancement layer 125 is then etched to expose the top surface 146 of the second conductive material 120. In one or more embodiments, the adhesion enhancement layer 125 is isotropically etched to expose the top surface 146 of the second conductive material 120.

In one or more embodiments, etching of the adhesion enhancement layer 125 results in the adhesion enhancement layer 125 remaining in the gaps 142 while being removed from the top surface 146 of the second conductive material 120. The etch back of the adhesion enhancement layer creates trenches 127 with a bottom surface being the top surface 146 of the second conductive material 120.

Figure 11A:
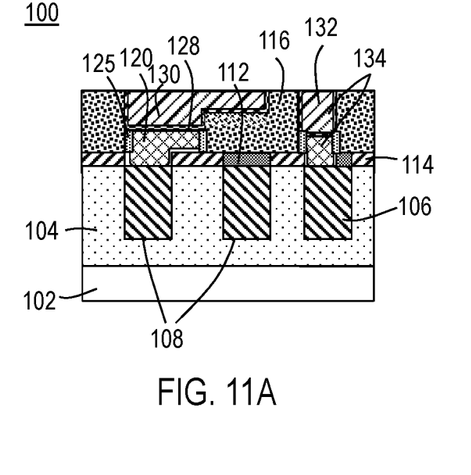
FIG. 11A illustrates a cross-sectional view of an electronic device according to one embodiment.
Figure 11B:
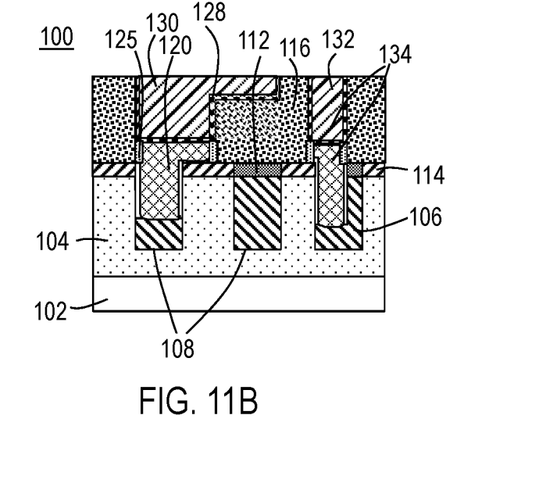
FIG. 11B illustrates a cross-sectional view of an electronic device according to one embodiment.

With reference to FIGS. 11A and 11B, in one or more embodiments, a second (or upper) metallization layer My may be formed by depositing one or more of a liner 128 or a metal film 130 on the top surface 146 of the second conductive material 120 in the trenches 127. In some embodiments, the metal film 130 may be deposited such that the metal film 130 overfills the trenches 127 creating an overburden (not illustrated). In one or more embodiments, portions (i.e. overburden) of the metal film 130 are removed using one or more of CMP or a back etch technique to even out with the top portions of the metal film 130, such that the metal film 130 is substantially coplanar with the second insulating layer 116.

In one or more embodiments, a liner 128 is deposited. In other embodiments, a liner 128 is not present. In some embodiments, the liner 128 is a conformal liner. In one or more embodiments, the liner 128 comprises one or more of titanium nitride (TiN), titanium (Ti), tantalum (Ta), or tantalum nitride (TaN). In an embodiment, the liner 128 is deposited using an atomic layer deposition (ALD) technique. In one or more embodiments, the liner 128 is deposited using one of deposition techniques, such as but not limited to a CVD, PVD, MBE, MOCVD, spin-on, or other liner deposition techniques know to one of ordinary skill in the art of microelectronic device manufacturing. In one or more embodiments, the liner 128 may be selectively removed using one or more of the dry and wet etching techniques known to one of ordinary skill in the art of electronic device manufacturing.

In one or more embodiments, the second (or upper) metallization layer My comprises metal film 130 which has a set of second conductive lines 132 that extend on portions of second insulating layer 116. The set of second conductive lines 132 extend along Y axis 124. The set of second conductive lines extending along a second direction that crosses the first direction at an angle. At least one via 134 is between the first conductive material 106, the second conductive material 120, and the metal film 130, wherein the via is self-aligned along the second direction to one of the first conductive lines. In one or more embodiments, the via 134 is self-aligned along the first direction to one of the second conductive lines.

The via 134 forms an upper metallization layer (My). In one or more embodiments, the upper metallization layer My is configured to connect to other metallization layers (not shown). In one or more embodiments, the metallization layer My is configures to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one or ordinary skill in the art of electronic device manufacturing.

One or more embodiments of the disclosure are directed to an electronic device. With reference to FIGS. 7A-10B, in one or more embodiments, an electronic device 100 comprises a substrate 102 comprising a first insulating layer 104 having a plurality of trenches 108 extending along a first direction, the plurality of trenches 108 having a first conductive material therein 106; an etch stop layer 112 on at least one of the first conductive materials 106; a mask layer 114 formed on the first insulating layer 104, the mask layer 114 having a top surface 115 substantially coplanar with a top surface 113 of the etch stop layer 112 and having a plurality of first openings 119 exposing a portion of the first conductive material 106, each of the plurality of first openings 119 having sidewalls 117; a second insulating layer 116 on the mask layer 114 and etch stop layer 112, the second insulating layer 116 having a plurality of via openings 118 aligned with the plurality of first openings 119 in the mask layer 114, each of the plurality of via openings 118 having sidewalls 121; a second conductive material 120 in the plurality of via openings 118 and the plurality of first openings 119 of the mask layer 114 and second insulating layer 116, the second conductive material 120 having gaps 142 between the second conductive material 120 and the sidewalls 121 of the via openings 118; and an adhesion enhancement layer 125 in the gaps 142. In one or more embodiments, the adhesion enhancement layer is not in the spaces between the sidewalls 117 of the plurality of openings 119 in the mask layer 114.

With reference to FIGS. 7B-10B, in one or more embodiments, in the electronic device 100, the first conductive material 106 is recessed so that the first conductive surface 105 is below the top surface 110 of the first insulating layer 104. The second conductive material 120 is on the recessed first conductive material 106.

FIGS. 12-17 depict an electronic device 200 formed according to one or more embodiments of the disclosure. The individual components of the electronic device 200, including the semiconductor substrate 202, the insulating layers 204, 216, the etch stop layer 212, 2 the conductive materials 206, 220, and the adhesion enhancement layer 125 can be formed by any suitable process or processes known to the skilled artisan. FIGS. 12-17 illustrate an electronic device 200 and a method of manufacturing an electronic device 200 according to one or more embodiments of the disclosure.

Figure 12:
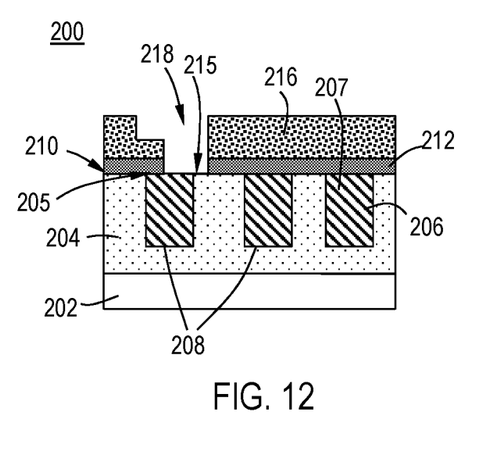
FIG. 12 illustrates a cross-sectional view of an electronic device according to one embodiment.

FIG. 12 depicts a cross-sectional view of an electronic device 200. In one or more embodiments, the electronic device 200 is obtained by a conventional dual damascene process. A substrate 202 is provided. As used in this specification and the appended claims, the term "provided" means that the substrate 202 is made available for processing (e.g., positioned in a processing chamber). In one or more embodiments, the substrate 202 has a first insulating layer 204, an etch stop layer 212, and a second insulating layer 216 thereon. The first insulating layer 204 has a top surface 210 and a plurality of trenches 208 formed along a first direction. The plurality of trenches 208 havea first conductive material 206 with a first conductive surface substrantially coplanar with the top surface 210 of the first insulating layer 104. The second insulating layer 216 and the etch stop layer 212 have at least one mis-aligned via opening 218 therethrough. The mis-aligned via opening 218 has a bottom surface 216 comprising an exposed portion of one or more of the top surface 210 of the first insulating layer 204 or a top surface of the first conductive material 206.

In one or more embodiments, the substrate 202 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, superconductor material such as niobium (Nb), niobium nitride (NbN), ytterbium cobalt (YbCo), or any combination thereof. In one or more embodiments, substrate 202 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 202 can be, e.g., an organic, a ceramic, a glass, or a semiconductor substrate. Although a few examples of materials from which the substrate 202 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, substrate 202 includes one or more metallization interconnect layers for integrated circuits. In at least some embodiments, the substrate 202 includes interconnects, for example, vias, configured to connect the metallization layers. In at least some embodiments, the substrate 202 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one or more embodiments, the substrate 102 includes one or more layers above substrate 202 to confine lattice dislocations and defects.

First insulating layer 204 can be any material suitable to insulate adjacent devices and prevent leakage. In one or more embodiments, electrically insulating layer 204 is an oxide layer, e.g., silicon dioxide, or any other electrically insulating layer determined by an electronic device design. In one or more embodiments, first insulating layer 204 comprises an interlayer dielectric (ILD). In one or more embodiments, first insulating layer 204 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof. While the term "silicon oxide" may be used to describe the first insulating layer 204, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, aluminum oxide, zirconium oxide, and the like.

In one or more embodiments, first insulating layer 204 includes a dielectric material having a K-value less than 5. In one or more embodiments, first insulating layer 204 includes a dielectric material having a K-value less than 2. In at least some embodiments, first insulating layer 204 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, first insulating layer 204 may include polyimide, epoxy, photodefinable materials, such as benzocyclobutene (BCB), and WPR-series materials, or spin-on-glass.

In one or more embodiments, first insulating layer 204 is a low-K interlayer dielectric to isolate one metal line from other metal lines on substrate 202. In one or more embodiments, the thickness of the first insulating layer 204 is in an approximate range from about 10 nanometers (nm) to about 2 microns (μm).

In one or more embodiments, first insulating layer 204 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

Referring to FIG. 12, a plurality of trenches 208 is formed along a first direction in the first insulating layer 204. A lower metallization layer (Mx) comprises a first conductive material 206 which comprises a set of conductive lines 207 that extend along an X axis (direction) 122 on the first insulating layer 104 on a substrate 102. The X axis of FIG. 12 extends orthogonally to the plane of the Figure page. As shown in FIG. 12, X axis (direction) 122 crosses Y axis (direction) 124 at an angle 126. In one or more embodiments, angle 126 is about 90 degrees. In another embodiment, angle 126 is an angle that is other than the 90 degrees angle. The first insulating layer 204 comprises trenches 208. The first conductive material 206 is deposited in trenches 208.

In one or more embodiments, the lower metallization layer Mx comprising first conductive material 206 is a part of a back end metallization of the electronic device. In one or more embodiments, the first insulating layer 204 is patterned and etched using a hard mask to form trenches 208 using one or more patterning and etching techniques known to one of ordinary skill in the art of microelectronic device manufacturing. In one or more embodiments, the size of trenches 208 in the first insulating layer 204 is determined by the size of conductive lines formed later on in a process.

In one or more embodiments, forming the first conductive material 206 involves filling the trenches 208 with a layer of conductive material. In one or more embodiments, a base layer (not shown) is first deposited on the internal sidewalls and bottom of the trenches 208, and then the conductive layer is deposited on the base layer. In one or more embodiments, the base layer includes a conductive seed layer (not shown) deposited on a conductive barrier layer (not shown). The seed layer can include copper (Cu), and the conductive barrier layer can include aluminum (Al), titanium (Ti), tantalum (Ta), tantalum nitride (TaN), and the like metals. The conductive barrier layer can be used to prevent diffusion of the conductive material from the seed layer, e.g., copper or cobalt, into the first insulating layer 204. Additionally, the conductive barrier layer can be used to provide adhesion for the seed layer (e.g., copper).

In one or more embodiments, to form the base layer, the conductive barrier layer is deposited onto the sidewalls and bottom of the trenches 208, and then the seed layer is deposited on the conductive barrier layer. In another embodiment, the conductive base layer includes the seed layer that is directly deposited onto the sidewalls and bottom of the trenches 208. Each of the conductive barrier layer and seed layer may be deposited using any thin film deposition technique known to one of ordinary skill in the art of semiconductor manufacturing, e.g., sputtering, blanket deposition, and the like. In one or more embodiments, each of the conductive barrier layer and the seed layer has the thickness in an approximate range from about 1 nm to about 100 nm. In one or more embodiments, the barrier layer may be a thin dielectric that has been etched to establish conductivity to the metal layer below. In one or more embodiments, the barrier layer may be omitted altogether and appropriate doping of the copper line may be used to make a "self-forming barrier".

In one or more embodiments, the conductive layer e.g., copper or cobalt, is deposited onto the seed layer of base layer of copper, by an electroplating process. In one or more embodiments, the conductive layer is deposited into the trenches 208 using a damascene process known to one of ordinary skill in the art of microelectronic device manufacturing. In one or more embodiments, the conductive layer is deposited onto the seed layer in the trenches 208 using a selective deposition technique, such as but not limited to electroplating, electrolysis, CVD, PVD, MBE, MOCVD, ALD, spin-on, or other deposition techniques know to one of ordinary skill in the art of microelectronic device manufacturing.

In one or more embodiments, the choice of a material for conductive layer for the first conductive material 206 determines the choice of a material for the seed layer. For example, if the material for the first conductive material 206 includes copper, the material for the seed layer also includes copper. In one or more embodiments, the first conductive material 106 includes a metal, for example, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Ag), platinum (Pt), indium (In), tin (Sn), lead (Pd), antimony (Sb), bismuth (Bi), zinc (Zn), cadmium (Cd), or any combination thereof.

In one or more embodiments, portions of the conductive layer and the base layer are removed to even out top portions of the first conductive material 206 with top portions of the first insulating layer 204 using a chemical-mechanical polishing ("CMP") technique known to one of ordinary skill in the art of microelectronic device manufacturing.

In one non-limiting example, the thickness (as measured along the z-axis of FIG. 12) of the first conductive material 206 is in an approximate range from about 15 nm to about 1000 nm. In one non-limiting example, the thickness of the first conductive material 206 is from about 20 nm to about 200 nm. In one non-limiting example, the width (as measured along the y-axis of FIG. 12) of the first conductive material 206 is in an approximate range from about 5 nm to about 500 nm. In one non-limiting example, the spacing (pitch) between the set of conductive lines of the first conductive material 206 is from about 2 nm to about 500 nm. In more specific non-limiting examples, the spacing (pitch) between the set of conductive lines of the first conductive material 206 is from about 5 nm to about 50 nm.

In one or more embodiments, the lower metallization layer Mx is configured to connect to other metallization layers (not shown). In one or more embodiments, the metallization layer Mx is configured to provide electrical contact to electronic devices, e.g., transistor, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Referring to FIG. 12, the etch stop layer 212 is deposited on the first insulating layer 204. In one or more embodiments, the etch stop layer 212 is deposited on the first insulating layer 204 and on the first conductive material 206. In one or more embodiments, the etch stop layer 212 comprises one or more of silicon nitride or aluminum oxide. In one or more specific embodiments, the etch stop layer 212 comprises silicon nitride. In one or more embodiments, the etch stop layer 212 has a thickness greater than 10 nm, including greater than 15 nm, or greater than 20 nm.

In one or more embodiments, a second insulating layer 216 is on the top surface of the etch stop layer 212.

The second insulating layer 216 can be any material suitable to insulate adjacent devices and prevent leakage. In one or more embodiments, the second insulating layer 216 is the same material as the first insulating layer 204. In one or more embodiments, the second insulating layer 216 is an oxide layer, e.g., silicon dioxide, or any other electrically insulating layer determined by an electronic device design. In one or more embodiments, second insulating layer 216 comprises an interlayer dielectric (ILD). In one or more embodiments, second insulating layer 216 is a low-K dielectric that includes, but is not limited to, materials such as, e.g., silicon dioxide, silicon oxide, carbon doped oxide ("CDO"), e.g., carbon doped silicon dioxide, porous silicon dioxide ($SiO_2$), silicon nitride (SiN), or any combination thereof.

In one or more embodiments, the second insulating layer 216 includes a dielectric material having a K-value less than 5. In one or more embodiments, second insulating layer 216 includes a dielectric material having a K-value less than 2. In at least some embodiments, second insulating layer 216 includes oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof, other electrically insulating layer determined by an electronic device design, or any combination thereof. In at least some embodiments, second insulating layer 216 may include polyimide, epoxy, photodefinable materials, such as benzocyclobutene (BCB), and WPR-series materials, or spin-on-glass.

In one or more embodiments, second insulating layer 216 is a low-K interlayer dielectric to isolate one metal line from other metal lines on substrate 202. In one or more embodiments, the thickness of the second insulating layer 216 is in an approximate range from about 10 nanometers (nm) to about 2 microns (μm).

In one or more embodiments, the first insulating layer 204 and the second insulating layer 216 are independently selected from oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof In one or more embodiments, a second insulating layer 216 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

In one or more embodiments, the second insulating layer 216 is planarized to form at least one mis-aligned via opening 218. The at least one mis-aligned via opening 218 has a bottom surface 215 comprising an exposed portion of the top surface 210 of the first insulating layer 204 and an exposed portion of the conductive surface of the first conductive material 206. As used herein, the term "planarized" refers to a process of smoothing surfaces and includes, but is not limited to, chemical mechanical polishing/planarization (CMP), etching, and the like. In one or more embodiments, planarizing the second insulating layer 216 comprises a dual damascene process.

Figure 13:
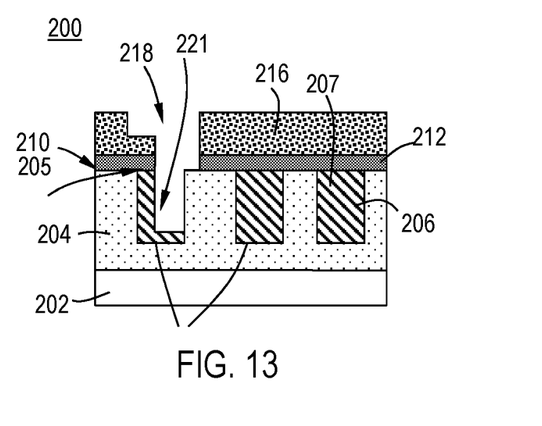
FIG. 13 illustrates a cross-sectional view of an electronic device according to one embodiment.

Referring to FIG. 13, in one or more embodiments, the first conductive material 206 is recessed through the at least one mis-aligned via opening 218 so that the exposed portion of the first conductive surface 205 is below the top surface 210 of the first insulating layer 204, creating an aligned via opening 221. In one or more embodiments, the first conductive material 206 is recessed using one or more of wet etching, dry etching, or a combination thereof techniques known to one of ordinary skill in the art of electronic device manufacturing.

Figure 14:
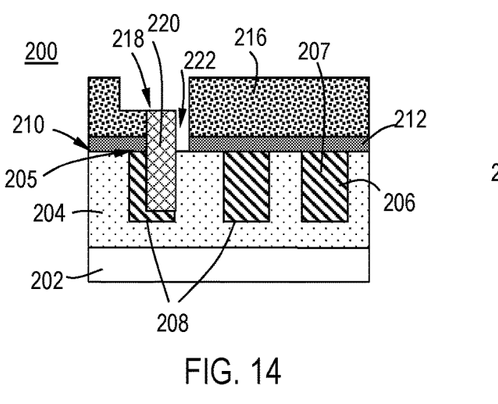
FIG. 14 illustrates a cross-sectional view of an electronic device according to one embodiment.

Referring to FIG. 14, a second conductive material is selectively deposited in the aligned via opening 221 on the first conductive material 206, wherein the second conductive material forms on the first conductive material 206 with gaps 222 between sides of the second conductive material 220 and one or more of the etch stop layer 212, or the second insulating layer 216.

In one or more embodiments, the second conductive material 220 comprises a metal film or a metal containing film. Suitable metal films include, but are not limited to, films including one or more of cobalt (Co), molybdenum (Mo), tungsten (W), tantalum (Ta), titanium (Ti), ruthenium (Ru), rhodium (Rh), copper (Cu), iron (Fe), manganese (Mn), vanadium (V), niobium (Nb), hafnium (Hf), zirconium (Zr), yttrium (Y), aluminum (Al), tin (Sn), chromium (Cr), lanthanum (La), or any combination thereof. In some embodiments, the second conductive material 220 comprises tungsten (W) or ruthenium (Ru).

In one or more embodiments, the second conductive material 220 is deposited using one of deposition techniques, such as but not limited to an ALD, a CVD, PVD, MBE, MOCVD, spin-on or other liner deposition techniques known to one of ordinary skill in the art of microelectronic device manufacturing.

In some embodiments, deposition of the second conductive material 220 includes formation of a seed gapfill layer (not shown). As will be understood by the skilled artisan, a seed gapfill layer is a relatively thin layer of material that can increase the nucleation rate (i.e., growth rate) of the second conductive material 220. In some embodiments, the seed gapfill layer is the same material as the second conductive material 220 deposited by a different technique. In some embodiments, the seed gapfill layer is a different material than the second conductive material 220.

In one or more embodiments, forming the second conductive material 220 involves depositing a layer of second conductive material in the at least one via opening 118.

In one non-limiting example, the thickness (as measured along the z-axis of FIG. 14) of the second conductive material 220 is in an approximate range from about 15 nm to about 1000 nm. In one non-limiting example, the thickness of the second conductive material 220 is from about 20 nm to about 200 nm. In one non-limiting example, the width (as measured along the y-axis of FIG. 14) of the second conductive material 220 is in an approximate range from about 5 nm to about 500 nm.

Figure 15:
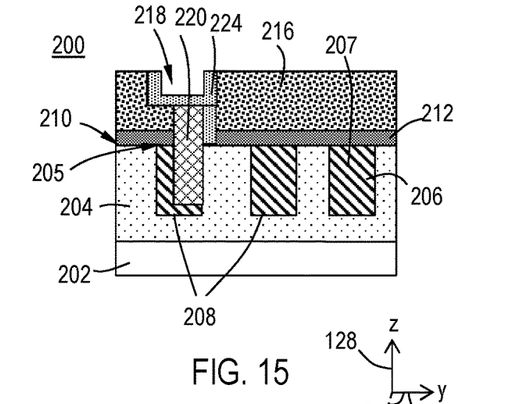
FIG. 15 illustrates a cross-sectional view of an electronic device according to one embodiment.

Referring to FIG. 15, an adhesion enhancement layer 224 is deposited in the gaps 222. The adhesion enhancement layer 224 can be any material suitable to fill gaps and promote adhesion between the second conductive material 220 and the sidewalls of the at least one aligned via opening 218.

In one or more embodiments, the adhesion enhancement layer 224 comprises silicon nitride. In one or more embodiments, the adhesion enhancement layer 224 is deposited using an atomic layer deposition (ALD) technique. In one or more embodiments, the adhesion enhancement layer 224 is deposited using one of deposition techniques, such as but not limited to a CVD, PVD, MBE, MOCVD, spin-on, or other liner deposition techniques know to one of ordinary skill in the art of microelectronic device manufacturing. Without intending to be bound by theory, it is thought that the adhesion enhancement layer 224 creates an anchor for the second conductive material 220 in order to prevent diffusion and improve adhesion.

Figure 16:
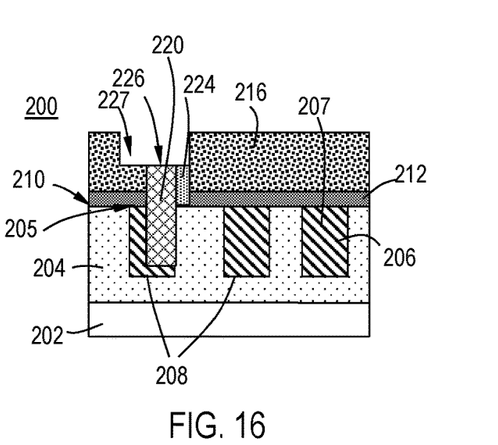
FIG. 16 illustrates a cross-sectional view of an electronic device according to one embodiment.

With reference to FIG. 16, the adhesion enhancement layer 224 is then etched to expose the top surface 226 of the second conductive material 220. In one or more embodiments, the adhesion enhancement layer 224 is isotropically etched to expose the top surface 226 of the second conductive material 220. In one or more embodiments, etching of the adhesion enhancement layer 224 results in the adhesion enhancement layer 224 remaining in the gaps 222 while being removed from the top surface 226 of the second conductive material 220. The etch back of the adhesion enhancement layer 224 creates trenches 227 with a bottom surface being one or more of the top surface 226 of the second conductive material 220 or a portion of the insulating layer 216.

Figure 17:
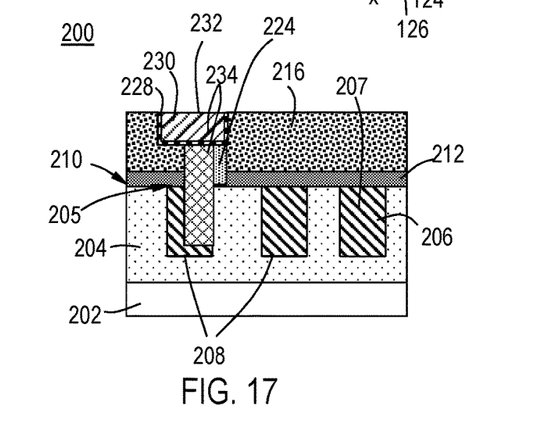
FIG. 17 illustrates a cross-sectional view of an electronic device according to one embodiment.

With reference to FIG. 17, in one or more embodiments, a second (or upper) metallization layer My may be formed by depositing one or more of a liner 228 or a metal film 230 on the top surface 226 of the second conductive material 220 in the trenches 227. In some embodiments, the metal film 230 may be deposited such that the metal film 230 overfills the trenches 227 creating an overburden (not illustrated). In one or more embodiments, portions (i.e. overburden) of the metal film 230 are removed using one or more of CMP or a back etch technique to even out with the top portions of the metal film 230, such that the metal film 230 is substantially coplanar with the second insulating layer 216.

In one or more embodiments, a liner 228 is deposited. In other embodiments, a liner 228 is not present. In some embodiments, the liner 228 is a conformal liner. In one or more embodiments, the liner 228 comprises one or more of titanium nitride (TiN), titanium (Ti), tantalum (Ta), or tantalum nitride (TaN). In an embodiment, the liner 228 is deposited using an atomic layer deposition (ALD) technique. In one or more embodiments, the liner 228 is deposited using one of deposition techniques, such as but not limited to a CVD, PVD, MBE, MOCVD, spin-on, or other liner deposition techniques know to one of ordinary skill in the art of microelectronic device manufacturing. In one or more embodiments, the liner 228 may be selectively removed using one or more of the dry and wet etching techniques known to one of ordinary skill in the art of electronic device manufacturing.

In one or more embodiments, the second (or upper) metallization layer My comprises metal film 230 which has a set of second conductive lines 232 that extend on portions of second insulating layer 216. The set of second conductive lines 232 extend along Y axis 124. The set of second conductive lines extending along a second direction that crosses the first direction at an angle. At least one via 234 is between the first conductive material 206, the second conductive material 220, and the metal film 230, wherein the via is self-aligned along the second direction to one of the first conductive lines. In one or more embodiments, the via 234 is self-aligned along the first direction to one of the second conductive lines.

The via 234 forms an upper metallization layer (My). In one or more embodiments, the upper metallization layer My is configured to connect to other metallization layers (not shown). In one or more embodiments, the metallization layer My is configures to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one or ordinary skill in the art of electronic device manufacturing.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming an electronic device, the method comprising:
   providing a substrate having a first insulating layer thereon, the first insulating layer having a top surface and a plurality of trenches formed along a first direction, the plurality of trenches having a first conductive material with a first conductive surface substantially coplanar with the top surface of the first insulating layer;
   selectively depositing an etch stop layer on the first conductive surface;
   forming a mask layer on the first insulating layer, the mask layer having a top surface substantially coplanar with a top surface of the etch stop layer;
   depositing a second insulating layer on the top surface of one or more of the etch stop layer or the mask layer;
   planarizing the second insulating layer to form at least one via opening, the at least one via opening having a bottom surface comprising an exposed portion of the top surface of the etch stop layer and an exposed portion of the top surface of the mask layer; and
   selectively removing the etch stop layer exposed through the via opening so that the bottom surface of the via opening comprises the first conductive material.

2. The method of claim 1, wherein the etch stop layer comprises one or more of silicon nitride, aluminum oxide, silicon carbonitride, hafnium oxide, silicon oxycarbonitride, or aluminum nitride.

3. The method of claim 1, wherein the first insulating layer and the second insulating layer are independently selected from oxides, carbon doped oxides, porous silicon dioxide, carbides, oxycarbides, nitrides, oxynitrides, oxycarbonitrides, polymers, phosphosilicate glass, fluorosilicate (SiOF) glass, organosilicate glass (SiOCH), or any combinations thereof.

4. The method of claim 1, wherein the mask layer comprises one or more of silicon dioxide, silicon oxycarbide, silicon carbonitride, or aluminum oxide.

5. The method of claim 1, wherein planarizing the second insulating layer comprises a dual damascene process.

6. The method of claim 1, wherein forming the mask layer on the first insulating layer comprises conformally depositing a mask material on the top surface of the first insulating layer and the etch stop layer; and planarizing the substrate to remove the mask material from the top surface of the etch stop layer to expose the etch stop layer.

7. The method of claim 1, further comprising depositing a second conductive material in the via opening on the first conductive surface.

8. The method of claim 7, wherein the first conductive material and the second conductive material independently comprise one or more of copper, ruthenium, nickel, cobalt, chromium, iron, manganese, titanium, aluminum, hafnium, tantalum, tungsten, vanadium, molybdenum, palladium, gold, silver, platinum, indium, tin, lead, antimony, bismuth, zinc, or cadmium.

9. The method of claim 7, wherein the second conductive material forms on the first conductive material with gaps between sides of the second conductive material and one or more of the etch stop layer or the second insulating layer.

10. The method of claim 9, further comprising depositing an adhesion enhancement layer in the gaps.

11. The method of claim 10, wherein the adhesion enhancement layer comprises silicon nitride.

12. The method of claim 11, further comprising:
selectively etching the adhesion enhancement layer to expose a top surface of the second conductive material;
depositing one or more of a liner or a metal film to form a metallization layer; and
optionally, planarizing the metallization layer.

13. The method of claim 1, further comprising recessing the first conductive material through the via opening so that the first conductive surface is below the top surface of the first insulating layer.

14. The method of claim 13, further comprising depositing a second conductive material in the via opening on the first conductive surface.

15. The method of claim 14, wherein the second conductive material forms on the first conductive material with gaps between sides of the second conductive material and one or more of the etch stop layer, the first insulating layer or the second insulating layer.

16. The method of claim 15, further comprising depositing an adhesion enhancement layer in the gaps.

* * * * *